United States Patent
Bonvalot

(10) Patent No.: US 8,429,813 B2
(45) Date of Patent: Apr. 30, 2013

(54) PROCESS TO ALLOW ELECTRICAL AND MECHANICAL CONNECTION OF AN ELECTRICAL DEVICE WITH A FACE EQUIPPED WITH CONTACT PADS

(75) Inventor: Beatrice Bonvalot, Bures sur Yvette (FR)

(73) Assignee: Gemalto SA, Meudon Cedex (FR)

( * ) Notice: Subject to any disclaimer, the term of this patent is extended or adjusted under 35 U.S.C. 154(b) by 2673 days.

(21) Appl. No.: 10/485,693

(22) PCT Filed: Aug. 2, 2002

(86) PCT No.: PCT/IB02/03041
§ 371 (c)(1),
(2), (4) Date: Sep. 22, 2004

(87) PCT Pub. No.: WO03/015153
PCT Pub. Date: Feb. 20, 2003

(65) Prior Publication Data
US 2005/0034303 A1  Feb. 17, 2005

(30) Foreign Application Priority Data
Aug. 3, 2001 (FR) .................................. 01 10483

(51) Int. Cl.
*H05K 3/30* (2006.01)
(52) U.S. Cl.
USPC ................... 29/832; 29/830; 29/840; 29/842; 29/852; 29/874; 174/260
(58) Field of Classification Search ............ 29/830–834, 29/846–852, 884, 874; 156/153, 275.5, 275.7; 438/106, 611; 257/618–622, 680–681; 174/255, 174/260–265
See application file for complete search history.

(56) References Cited

U.S. PATENT DOCUMENTS

| | | | | |
|---|---|---|---|---|
| 4,008,300 A | * | 2/1977 | Ponn | 264/104 |
| 4,574,095 A | * | 3/1986 | Baum et al. | 427/584 |
| 4,897,338 A | * | 1/1990 | Spicciati et al. | 430/314 |
| 4,941,255 A | * | 7/1990 | Bull | 29/833 |
| 5,501,755 A | * | 3/1996 | Dahlquist | 156/153 |
| 5,629,238 A | * | 5/1997 | Choi et al. | 438/645 |
| 5,659,952 A | * | 8/1997 | Kovac et al. | 29/840 |
| 5,674,787 A | * | 10/1997 | Zhao et al. | 438/627 |
| 5,747,101 A | | 5/1998 | Booth et al. | |
| 6,025,638 A | * | 2/2000 | Pogge et al. | 257/618 |
| 6,256,874 B1 | | 7/2001 | Datta et al. | |
| 6,627,477 B1 | * | 9/2003 | Hakey et al. | 438/106 |
| 6,662,443 B2 | * | 12/2003 | Chou et al. | 29/852 |
| 6,834,426 B1 | * | 12/2004 | Japp et al. | 29/830 |
| 7,262,505 B2 | * | 8/2007 | Ahn et al. | 257/762 |

FOREIGN PATENT DOCUMENTS
DE    198 00 566 A    7/1999

* cited by examiner

*Primary Examiner* — Minh Trinh
(74) *Attorney, Agent, or Firm* — Cozen O'Connor

(57) ABSTRACT

A method of manufacturing an electrical device that is electrically and mechanically connectable to another electrical device is presented. The electrical device includes a face equipped with contact pads. The method includes applying an adhesive layer on the face equipped with contact pads. The adhesive layer is composed of a substance with adhesive properties. The method further includes creating a plurality of openings through the adhesive layer over each contact pad, and growing, electrolessly or electrochemically, small metal sticks in the areas where the openings have been created to form a plurality of conductive paths over each contact pad, the volume of which is defined by the openings.

7 Claims, 4 Drawing Sheets

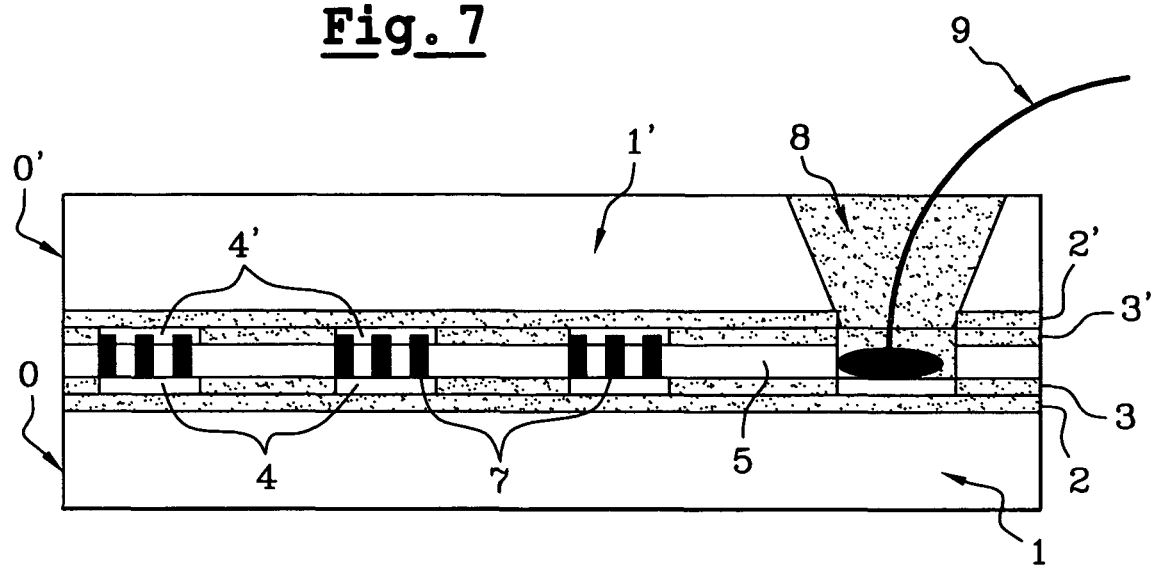
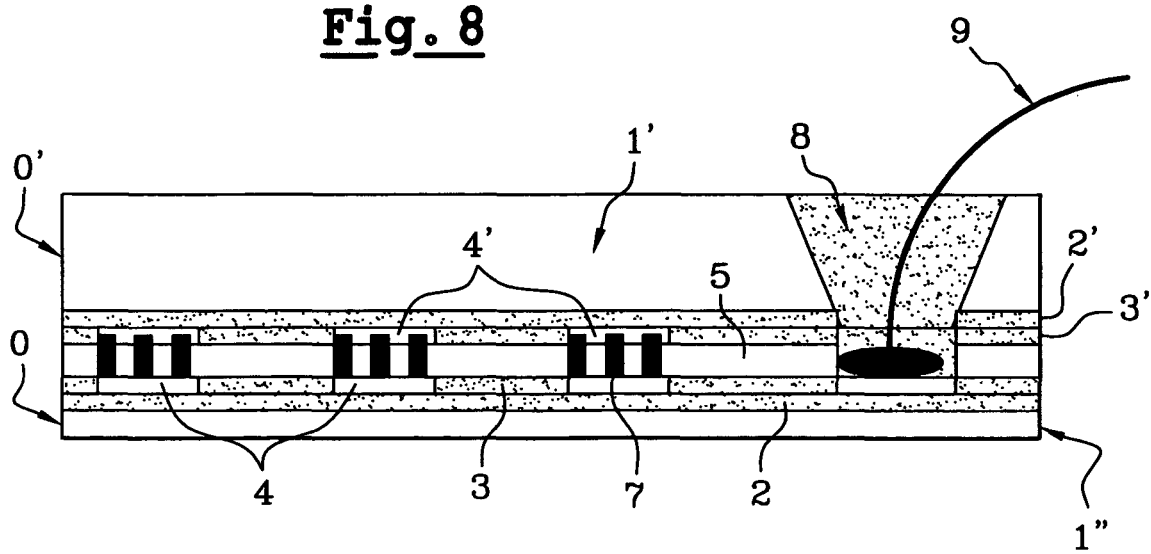

PROCESS TO ALLOW ELECTRICAL AND MECHANICAL CONNECTION OF AN ELECTRICAL DEVICE WITH A FACE EQUIPPED WITH CONTACT PADS

This is a U.S. national stage of application No. PCT/IB02/03041, filed on 2 Aug. 2002.

BACKGROUND OF THE INVENTION

1. Field of the Invention

This invention concerns the electrical and mechanical connection of an electrical device with another electrical device. Both could be for example a wafer, an integrated circuit or even just a component. This invention applies especially to the field of integrated circuits protection and in particular in the field of memory cards.

2. Description of Related Art

A connection process is based on the use of a film called ACF (Anisotropic Conductor Film). This type of film contains conducting elements extending through the film thickness. According to a first stage, the film is made separately onto a neutral support. According to a second stage, the film is finely recovered using sub-engraving. According to a third stage, the film is pasted with glue on each face to apply it then onto a first component. A last stage consists in connecting a second component onto the part of the film that is not yet covered. Finally, both components are fixed mechanically through the glue pasted on both faces of the film, and electrically using the metal elements enclosed in the film.

U.S. Pat. No. 6,256,874 describes a method for connecting two conductive layers in an electronic circuit package comprising the steps of forming dentrites on selected regions of a first conductive layer, forming dentrites on selected regions of a second conductive layer. Dentrites are formed by means of a photoresist material to the area of a first surface metal and then expose and develop the resist by photolithographic techniques to provide an exposed area on which dentrites are to be formed. The photoresist is then removed. The method further comprises the step of applying an epoxy adhesive material over the first conductive layer, and compressively attaching the second conductive layer to the first conductive layer such that the dentrites on the first conductive layer contact the dentrites on the second conductive layer.

SUMMARY OF THE INVENTION

An object of the invention is to reduce the costs.

According to one aspect of the invention a method of manufacturing an electrical device that is electrically and mechanically connectable to another electrical device, the electrical device having a face equipped with contact pads, the method being characterised in that it includes:

- a layer-application step in which an adhesive layer is applied on the face equipped with contact pads, the adhesive layer being composed of a substance with adhesive properties;
- an opening-creation step in which an opening is created through the adhesive layer at the level of a contact pad;
- an opening-filling step in which the opening is filled with a conductive material so that the opening is substantially filled with the conductive material so as to form a conductive path the volume of which is defined by the opening.

The adhesive layer is, as it were, used as a mould to form the conductive path. Consequently there is no need for a specific photoresist layer as in U.S. Pat. No. 6,256,874. The invention thus allows a reduction of the costs.

BRIEF DESCRIPTION OF THE DRAWINGS

This invention shall be better grasped after reading the following non-limiting description, written by reference to the attached drawings, where:

FIG. 7 shows, as a cross-section, the plates after the stage of fixing by thermo-compression;

FIG. 8 shows, as a cross-section, the first-plate tapering.

DETAILED DESCRIPTION OF THE PREFERRED EMBODIMENTS

Figure 1:
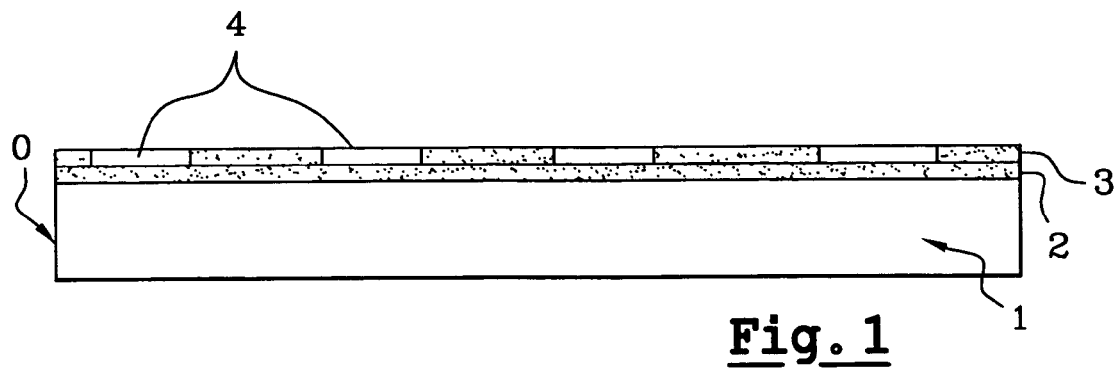
FIG. 1 shows as a cross-section, a plate which is a starting point for the invention process.

FIG. 1 shows a starting point in the process according to the invention. It shows a plate 0 including a silicium chip 1 on which are arranged circuits 2. A passivation layer 3 is superimposed on the layer including circuits 2. In this passivation layer 3 there are contact pads 4 inserted with the purpose to arrange interconnection with additional circuit.

Figure 2:
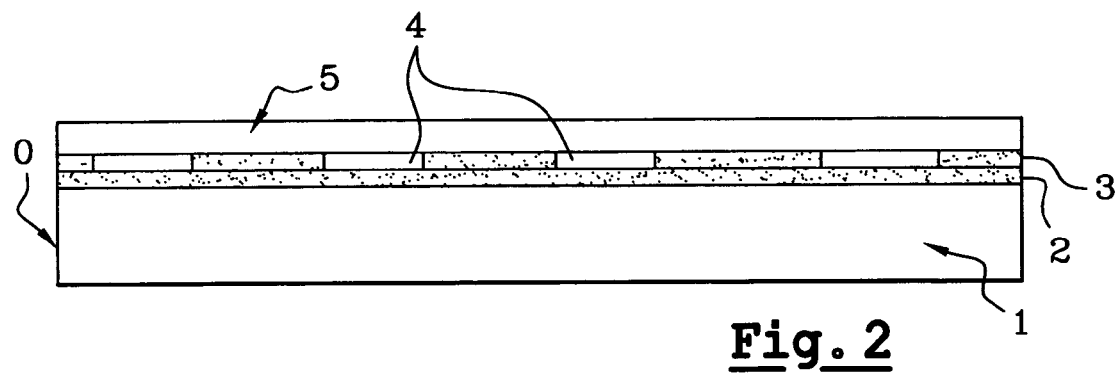
FIG. 2 shows as a cross-section, a fixing organic layer applied to the plate according to a first stage in the process subject of the invention.

FIG. 2 shows the first stage in the process, actually a stage of laying down an organic layer 5 with sticking characteristics. This organic layer is superimposed on the passivation layer 3 including contact pads 4. This organic layer 5 is for instance laid in the form of a solution obtained by centrifuging. The gaps 6 in the organic layer 5 show where organic matter has been removed from the organic layer 5.

Figure 3:
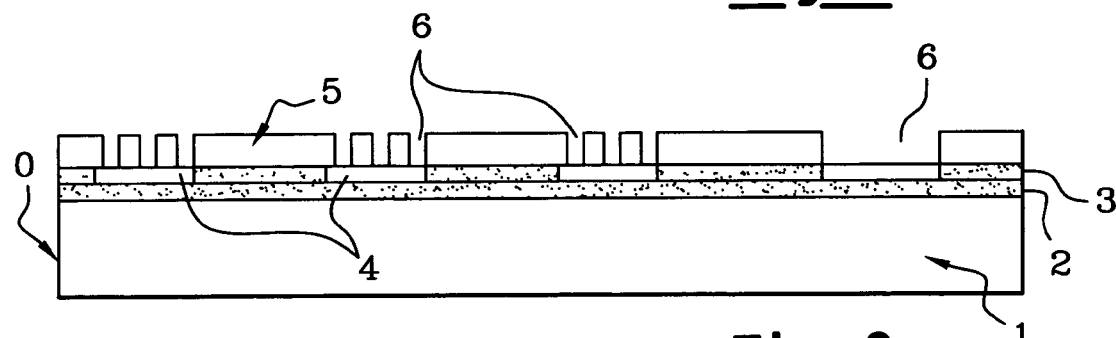
FIG. 3 shows as a cross-section, a fixing organic layer that has been structured according to a second stage in the process subject of the invention.

After a drying stage, and as shown by FIG. 3, organic matter in the organic layer 5 is removed partially or completely to produce the gap 6, and this is in particular at the level of the contact pads 4. This organic matter removal may be achieved for instance by etching. If the organic matter is photosensitive, it may be also exposed, after applying a masker, to rays and in particular to UV rays. The parts of organic matter exposed are finally dissolved using a chemical bath. The organic layer 5 so modified is said to be formed into a structure.

Figure 4:
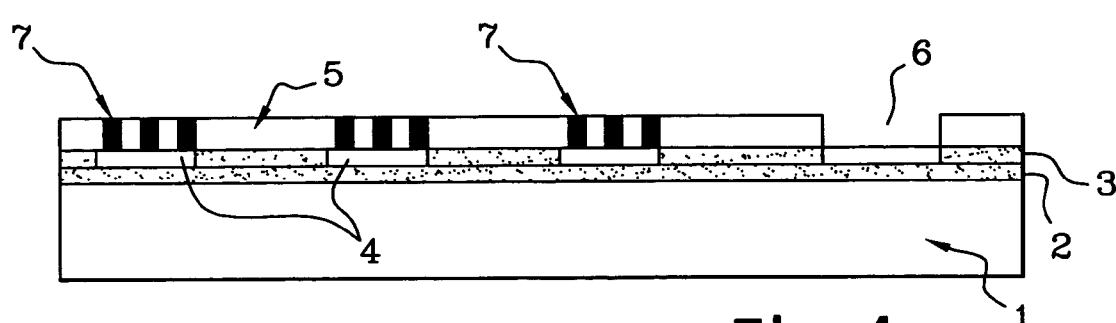
FIG. 4 shows the stage in the process according to the invention in which the fixing layer is equipped with small metal sticks.

FIG. 4 shows the following stage which is a stage of growth for small metal sticks 7 in the areas where the organic matter has been removed. This metal stick growth is achieved for instance in chemical baths using electroless or electrochemistry. The small metal sticks 7 are directed preferably perpendicular to the contact pad surface 4 and are insulated from each other by the organic matter in layer 5. Although FIG. 4 suggests the existence of small metal sticks 7 at the level of the contact pads 4, this does not exclude the possibility to also grow some in other areas.

Figure 6:
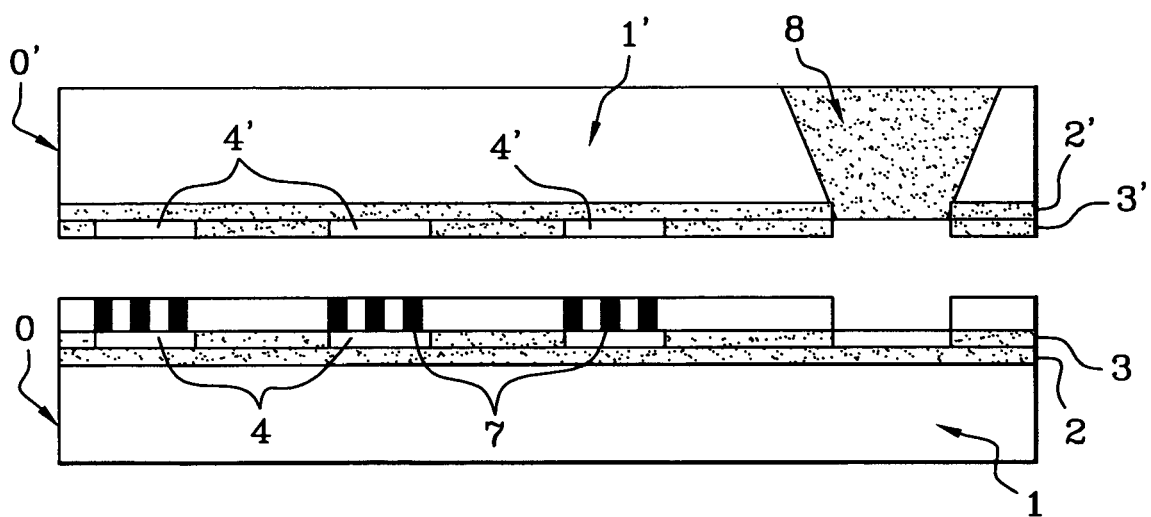
FIG. 6 shows the beginning of the fixing stage according to the invention process.

The following stage, as shown on FIG. 6, is a stage to align a second plate 0' of the same type as plate 0 on the first plate 0 so that the contact pads 4 and 4' face each other. This second plate may include circuits 2' necessary for the operation of circuits 2.

In a later stage, as described in FIG. 7, both plates 0 and 0' are fixed, for example, using thermo-compression. Ultrasound techniques may also be used advantageously.

Plate 0' includes media 8 so as to allow the electrical contacts 4 to exit to the outside by means, for instance, of the wiring cable 9 as can be seen on FIG. 7.

FIG. 8 shows that it is possible to proceed next to the plate 0 tapering at the level of its lower face 1" in order, for instance, to enable a possible slip sheet inserting into a card body or so as to increase the difficulty in separating circuits for safety.

Of course, the description of the invention embodiment as given above is not limiting for the invention which must be understood broadly.

In particular, the subject of this invention may apply not only to the field of mechanical and electrical connections at the level of a component or an integrated circuit, but also at the level of any other electrical device with a face equipped with contact pads. It may be in particular a question of wafers of any size, for example with a diameter of 150 mm and comprising approximately one thousand components.

Regarding the organic layer 5, any material preferably with sticking characteristics, may be used. This may be in particular polyimides, photosensitive resins or thermoplastics. These materials also have the advantage of stimulating the growth of metal compounds.

The use of thermoplastics is interesting since it will be possible to separate without damage the two electrical elements. On the other hand, the polyimides will be used with an advantage whenever it is intended to make difficult the separation of the two components without physical damage. This is particularly interesting in the field of memory cards regarding physical security.

The small metal sticks 7 may be more generally metal compounds, for example compounds with nickel, palladium or copper.

Figure 5:
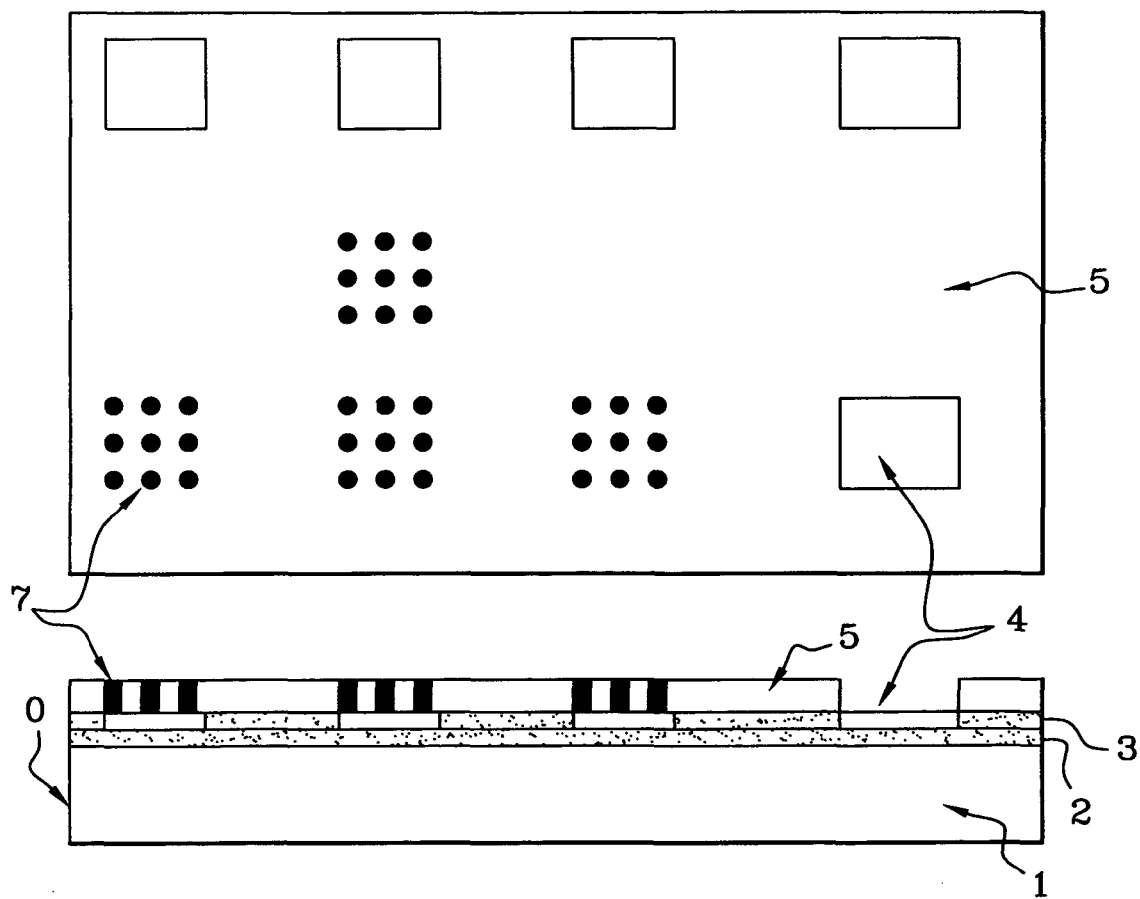
FIG. 5 shows, as a horizontal projection and as a cross-section, part of a plate.

Preferably, as can be seen on FIG. 5, several small metal sticks 7 can be grown per contact area 4, typically about ten. This allows relatively good quality electrical contacts. The metal small sticks diameter is between, for example, 10 and 30 μm.

The metal contact structure (4,7,4') according to this invention avoids what is called contact recovery. This is because on the market wafers, localised oxidation patches often exist on contact pads, that are generally in aluminium. The contact recovery consists in cleaning these contact pads to remove the oxidation so as to have good quality electrical connections. However the contact structure according to this invention (4,7,4'), especially because of the number and the reduced size of the cross-section of small metal sticks 7 in relation to the size of the oxidation patches, enables eliminating this stage called contact recovery.

Let us assume for instance that, at the level of a certain contact pad, there are 25 metal small sticks. Let us assume also that there is an oxidation patch that prevents 10 of these 25 small sticks to be in contact with the contact pad. In this case, there remains 15 metal small sticks in contact and ensuring however a rather good electrical connection between the electrical devices.

In the case, in particular, of fixing by thermo-compression, it is better if the conductive paths 7 shown on FIG. 7 have a length higher than the organic layer thickness 5, so that when fixing, there is a good interpenetration of these paths in the metal of the contact pads 4' of the second plate 0'. Generally, these pads are in aluminium and are about 1 μm thick.

Also other modes of embodiment are likely to give results that are particularly interesting.

At the interface fixing level (5,7), several layers of composite materials may be used. An intermediary layer may be used to rearrange the contact areas 4 on the interface (5,7). Further to structuring a first organic layer, metal tracks may be created by deposition. A second structured organic layer may again be used for the growth of metallic compounds.

Several layers analogous to the organic layer 5 may be used in this way, either to create conducting media, or to create metal tracks. The last stage remains the stage of the electrical and mechanical connection with the second electrical device.

Several layers, analogous to the organic layer 5, may also be used to improve the security and the complexity of the interface. A multi-layer may also improve the quality of fixing via a better planishing of the circuit surface or a look for a better chemical reactivity.

After the growth of metal small sticks in the organic layer 5 which acts as the fixing layer, the plate may be divided into smaller electrical entities, for instance integrated circuits or components. These electrical entities may then be mounted using the technique called Flip chip. The material in the organic layer is used as the sticking agent on the support. It is thus possible to get connections in the order of 10 μm instead of the 40 to 60 μm obtained using the flip chip technique. This reduction in the connection size is especially advantageous in the field of high frequencies.

What is claimed is:

1. A method of manufacturing an electrical device that is electrically and mechanically connectable to another electrical device, the electrical device having a face equipped with contact pads, the method comprises the steps of:
    applying an adhesive layer on the face equipped with contact pads, the adhesive layer being composed of a substance with adhesive properties;
    creating a plurality of openings through the adhesive layer over each contact pad; and
    growing, electrolessly or electrochemically, small metal sticks in the areas where the openings have been created to form a plurality of conductive paths over each contact pad, the volume of the conductive paths being defined by the openings,
    wherein the small sticks are configured to extend beyond a plane of the adhesive layer.

2. The method according to claim 1 further comprising the step of applying a fixing layer comprising a polyimide.

3. The method according to claim 2 wherein the plurality of openings are created through the fixing layer over each contact pad.

4. The method according to claim 1 wherein the metal sticks comprise nickel, palladium, or copper.

5. The method according to claim 1 wherein the conductive paths have a length longer than the thickness of the adhesive layer.

6. The method according to claim 1 wherein the diameter of the metal sticks is between 10 and 30 μm.

7. The method according to claim 1 wherein the small sticks extend beyond the plane of the adhesive layer after thermocompression of the adhesive layer.

* * * * *